United States Patent
Xu et al.

(10) Patent No.: US 7,348,821 B2
(45) Date of Patent: Mar. 25, 2008

(54) PROGRAMMABLE HIGH-RESOLUTION TIMING JITTER INJECTORS HIGH-RESOLUTION TIMING JITTER INJECTORS

(75) Inventors: Jianping Xu, Portland, OR (US); KyeHyung Lee, Corvallis, OR (US); Fabrice Paillet, Hillsboro, OR (US); David Rennie, Etobicoke (CA); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 10/946,709

(22) Filed: Sep. 22, 2004

(65) Prior Publication Data

US 2006/0061399 A1    Mar. 23, 2006

(51) Int. Cl.
   *H03H 11/26*    (2006.01)
(52) U.S. Cl. .................. 327/276; 327/263; 327/287
(58) Field of Classification Search ........ 327/156–160, 327/147–149, 261, 263, 270, 276
See application file for complete search history.

(56) References Cited

U.S. PATENT DOCUMENTS

| | | | | |
|---|---|---|---|---|
| 5,144,174 A * | 9/1992 | Murakami | ............ | 327/277 |
| 6,160,856 A * | 12/2000 | Gershon | ............ | 375/320 |
| 6,400,735 B1 * | 6/2002 | Percey | ............ | 370/518 |
| 6,424,199 B2 * | 7/2002 | Taguchi et al. | ............ | 327/292 |
| 6,642,760 B1 * | 11/2003 | Alon et al. | ............ | 327/158 |
| 6,727,738 B2 * | 4/2004 | Tsukikawa | ............ | 327/160 |
| 6,735,148 B2 * | 5/2004 | Gomm | ............ | 365/233 |
| 6,784,714 B2 * | 8/2004 | Nakamura | ............ | 327/271 |
| 6,804,165 B2 * | 10/2004 | Schrogmeier et al. | ...... | 365/233 |
| 6,958,640 B2 | 10/2005 | Lee et al. | | |
| 2002/0130691 A1 * | 9/2002 | Silvestri | ............ | 327/158 |

OTHER PUBLICATIONS

Maneatis, John G., "Low-Jitter Process-Independent DLL and PLL Based on Self-Biased Techniques", *IEEE Journal of Solid-State Circuits*, 31(11), (Nov. 1996), 1723-1732.

Noda, H, et al., "An on-chip timing adjuster with sub-100-ps resolution for a high-speed DRAM interface", *Digest of Technical Papers. 1998 Symposium on VLSI Circuits*, (Jun. 11-13, 1998), 62-63.

* cited by examiner

*Primary Examiner*—Dinh T. Le
(74) *Attorney, Agent, or Firm*—Schwegman, Lundberg & Woessner, P.A.

(57) ABSTRACT

A device includes a first circuit having rows and columns of delay cells to generate delayed signals based on an input signal. The delayed signals are selectable and have a different delay from one another with respect to the input signal. The device is programmable based on a delay code. Different values of the delay code allow the device to select different delayed signals. The device may select one of the delayed signals from the first circuit for use as a timing signal in a second circuit of the device. The device may also use the delayed signals from the first circuit to evaluate a clock and data recovery circuit. In an embodiment, the circuits may be located on a single die.

40 Claims, 13 Drawing Sheets

US 7,348,821 B2

PROGRAMMABLE HIGH-RESOLUTION TIMING JITTER INJECTORS HIGH-RESOLUTION TIMING JITTER INJECTORS

FIELD

Embodiments of the present invention relate to delay circuits in semiconductor devices.

BACKGROUND

Semiconductor devices such as processors and memory devices reside in many computers and electronic products to process and store data. Some of these devices use recovery circuits to recover the original versions of the clock and data signals that may be degraded by signal jitter or other forms of noise.

In many cases, the recovery circuit may be evaluated to determine its performance limitations. Some evaluation methods use external test equipment to inject signal noise into signal paths of the recovery circuit to simulate actual operating conditions. Output data from the recovery circuit is evaluated to determine the performance of the recovery circuit.

As semiconductor devices increasingly operate at relatively higher frequencies, the recovery circuits also operate at relatively higher frequencies. Therefore, in some cases, external test equipment may become more expensive to properly test high-frequency recovery circuits.

DESCRIPTION OF EMBODIMENTS

Figure 1:
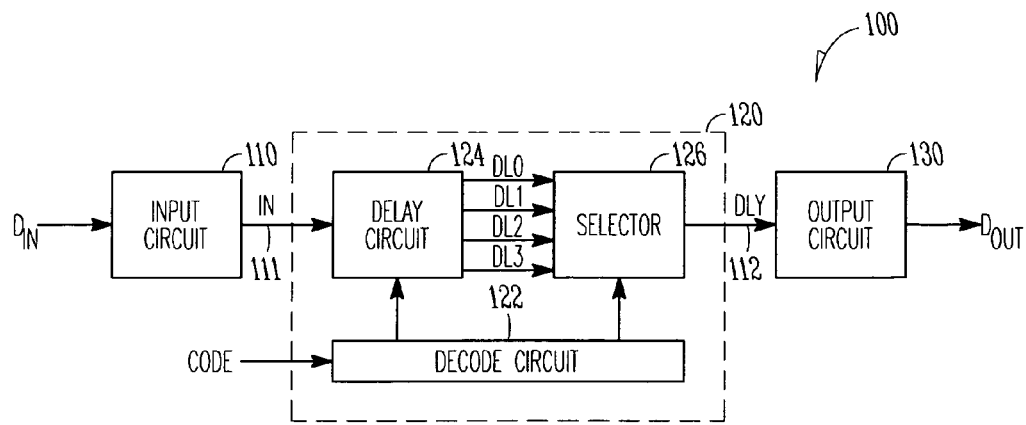
FIG. 1 shows a timing delay injector according to embodiments of the invention.

The following description and the drawings illustrate specific embodiments of the invention sufficiently to enable those skilled in the art to practice them. Other embodiments may incorporate structural, logical, electrical, process, and other changes. Such embodiments of the inventive subject matter may be referred to, individually and/or collectively, herein by the term "invention" merely for convenience and without intending to voluntarily limit the scope of this application to any single invention or inventive concept if more than one is in fact disclosed. In the drawings, like features or like numerals describe substantially similar components throughout the several views. Examples merely typify possible variations. Portions and features of some embodiments may be included in or substituted for those of others. The scope of the inventive subject matter encompasses the claims and all available equivalents.

FIG. 1 shows a timing delay injector according to embodiments of the invention. Timing delay injector 100 includes input buffer or input circuit 110, programmable delayed signal generator 120, and output buffer or output circuit 130. Input circuit 110 receives input signal $D_{IN}$ and generates signal IN. Programmable delayed signal generator 120 generates delayed signal DLY based on the IN signal. Output circuit 130 provides output signal $D_{OUT}$ based on the DLY signal. The $D_{OUT}$ signal has a delay relative to the $D_{IN}$ signal. Programmable delayed signal generator 120 controls the delay between the $D_{IN}$ and $D_{OUT}$ signals based on the value of delay code CODE.

Programmable delayed signal generator 120 includes decode circuit 122, delay circuit 124, and selector 126. Decode circuit 122 decodes the CODE. In some embodiments, the CODE is a digital code. Delay circuit 124 generates a plurality of delayed signals DL0, DL1, DL2, and DL3 based on the IN signal. Selector 126 responds to the CODE to select a selected delayed signal from the DL0, DL1, DL2, and DL3 signals. The DLY signal represents the selected delay signal. Since the $D_{OUT}$ signal is provided based on the DLY signal and since the DLY signal is selected from the DL0, DL1, DL2, and DL3 signals, the $D_{OUT}$ signal is also provided based on the DL0, DL1, DL2, and DL3 signals. FIG. 1 shows four delayed signals DL0, DL1, DL2, and DL3 as an example. The number of the delayed signals may be different from four, e.g. higher or lower than four.

Programmable delayed signal generator 120 provides a delay range. The delay range is measured by units of time. For example, the delay range may be from X picoseconds to Y picoseconds, where X and Y are positive numbers. Programmable delayed signal generator 120 injects a delay (an amount of time delay) within the delay range into the signal path of the DIN signal between nodes 111 and 112, such that the $D_{OUT}$ signal is delayed from the $D_{IN}$ signal by the delay equal to the injected delay. In this specification, the delay is occasionally referred to as the "amount of delay".

The amount of delay injected by programmable delayed signal generator 120 is a known delay. The value of the CODE determines the amount of delay. Different values of the CODE correspond to different amounts of delay within the delay range. By setting an appropriate value for the CODE, programmable delayed signal generator 120 is able to inject a known delay into the signal path of the $D_{IN}$ signal. Thus, by setting different values for the CODE, a plurality of $D_{OUT}$ signals may be obtained, in which each of the plurality of $D_{OUT}$ signals has a delay different from one another with respect to the $D_{IN}$ signal.

In some embodiments, the value of the CODE is set during a programming process. For example, the value of the CODE may be set by applying a combination of signals having a binary value. In some embodiments, the value of the CODE may be set by software.

As described above, since different $D_{OUT}$ signals with different known delays relative to the $D_{IN}$ signal may be obtained, timing delay injector 100 may be programmed to select an appropriate $D_{OUT}$ signal with a known delay relative to the $D_{IN}$ signal. Thus, in some applications, timing delay injector 100 provides flexibility in choosing a $D_{OUT}$ signal that may be used as a timing or control signal in a second circuit.

In other applications, timing delay injector 100 may be used to evaluate a performance of a circuit by feeding the circuit with different $D_{OUT}$ signals each having different known delays relative to the $D_{IN}$ signal. For example, timing delay injector 100 may be used to evaluate a performance of a clock recovery circuit of an optical link transceiver.

In some embodiments, each of the signals $D_{IN}$, IN, DL0, DL1, DL2, DL3, DLY and $D_{OUT}$ includes a differential signal pair.

Figure 2:
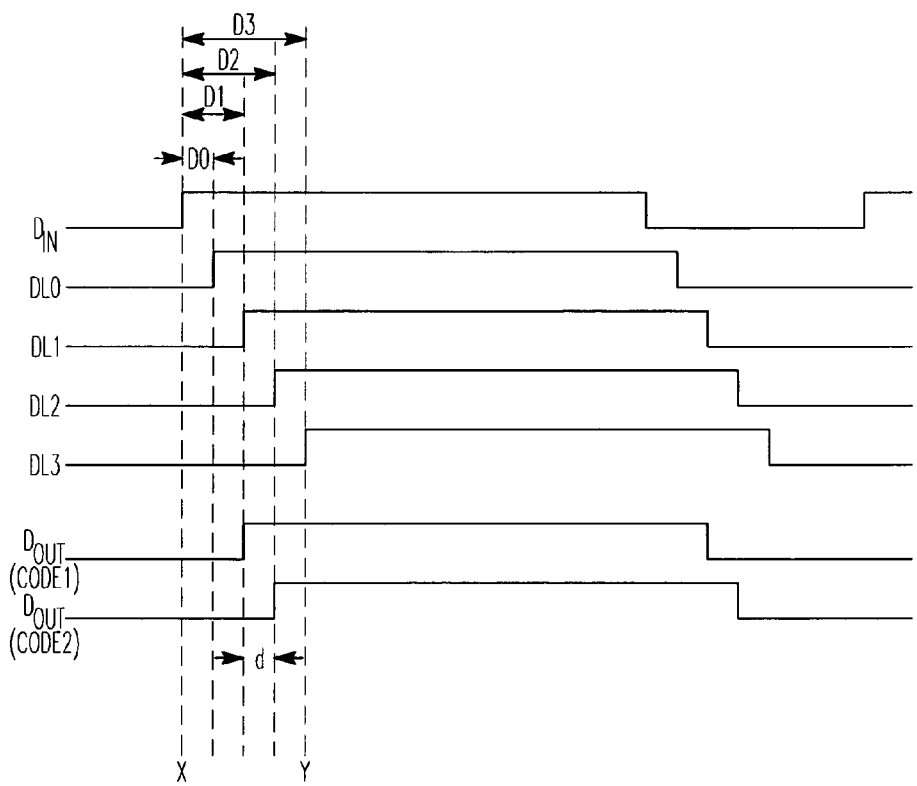
FIG. 2 is an exemplary timing diagram for FIG. 1.

FIG. 2 is an exemplary timing diagram for FIG. 1. In FIG. 2, D0, D1, D2, and D3 represent the delay between the $D_{IN}$ signal and the DL0, DL1, DL2, and DL3 signals. The time between X and Y represents the value of the delay range. As described in FIG. 1, each value of the CODE selects a different $D_{OUT}$ signal. FIG. 2 shows two different $D_{OUT}$ signals based on two different values (CODE1 and CODE2) of the CODE.

As shown in FIG. 2, the DL0, DL1, DL2, and DL3 signals each have different delays (D0, D1, D2, and D3) relative to the $D_{IN}$ signal. Based on the value of the CODE, the DL0, DL1, DL2, and DL3 signals may be selected to produce the $D_{OUT}$ signal. For example, with a first value (CODE1) of the CODE, the DL1 signal is selected such that the $D_{OUT}$ signal is produced based on the DL1 signal. As another example, with a second value (CODE2) of the CODE, the DL2 signal is selected such that the $D_{OUT}$ signal is produced based on the DL2 signal. FIG. 2 shows that the $D_{OUT}$ signal with CODE1 has a delay of D1 relative to the $D_{IN}$ signal; the $D_{OUT}$ signal with CODE2 has a delay of D2 relative to the $D_{IN}$ signal.

Since each value of the CODE corresponds to a known delay, each of the delay D1 and delay D2 in FIG. 2 is a known value. Thus, the delay between the $D_{OUT}$ signal and the $D_{IN}$ signal is a known delay. Further, label "d" in FIG. 2 is the difference between D2 and D1. Since each of the delay D1 and delay D2 in FIG. 2 is a known value, delay "d" is also a known value. In some embodiments, delay "d" is a timing resolution of the delay range indicated by X and Y. A delay between one $D_{OUT}$ signal (corresponding one value of the CODE) and another $D_{OUT}$ signal (corresponding to another value of the CODE) may be chosen to be a multiple of the resolution. In some embodiments, delay circuit 124 of FIG. 1 is constructed such the delay "d" is about two picoseconds.

As shown in FIG. 2, two different $D_{OUT}$ signals with a known delay "d" between those two $D_{OUT}$ signals may be obtained by setting different values for the CODE. Similarly, many different $D_{OUT}$ signals with a known delay between any two of those many different $D_{OUT}$ signals may also be obtained by setting the values of the CODE to different values. As described in FIG. 1, different $D_{OUT}$ signals with a known delay such as delay "d" of FIG. 2 allows timing delay injector 100 of FIG. 1 to be used in many applications. For example, in one application, the $D_{OUT}$ signal may be used as a timing or control signal for a second circuit. In another application, the $D_{OUT}$ signal may be used to evaluate a circuit such as a clock recovery circuit.

Figure 3:
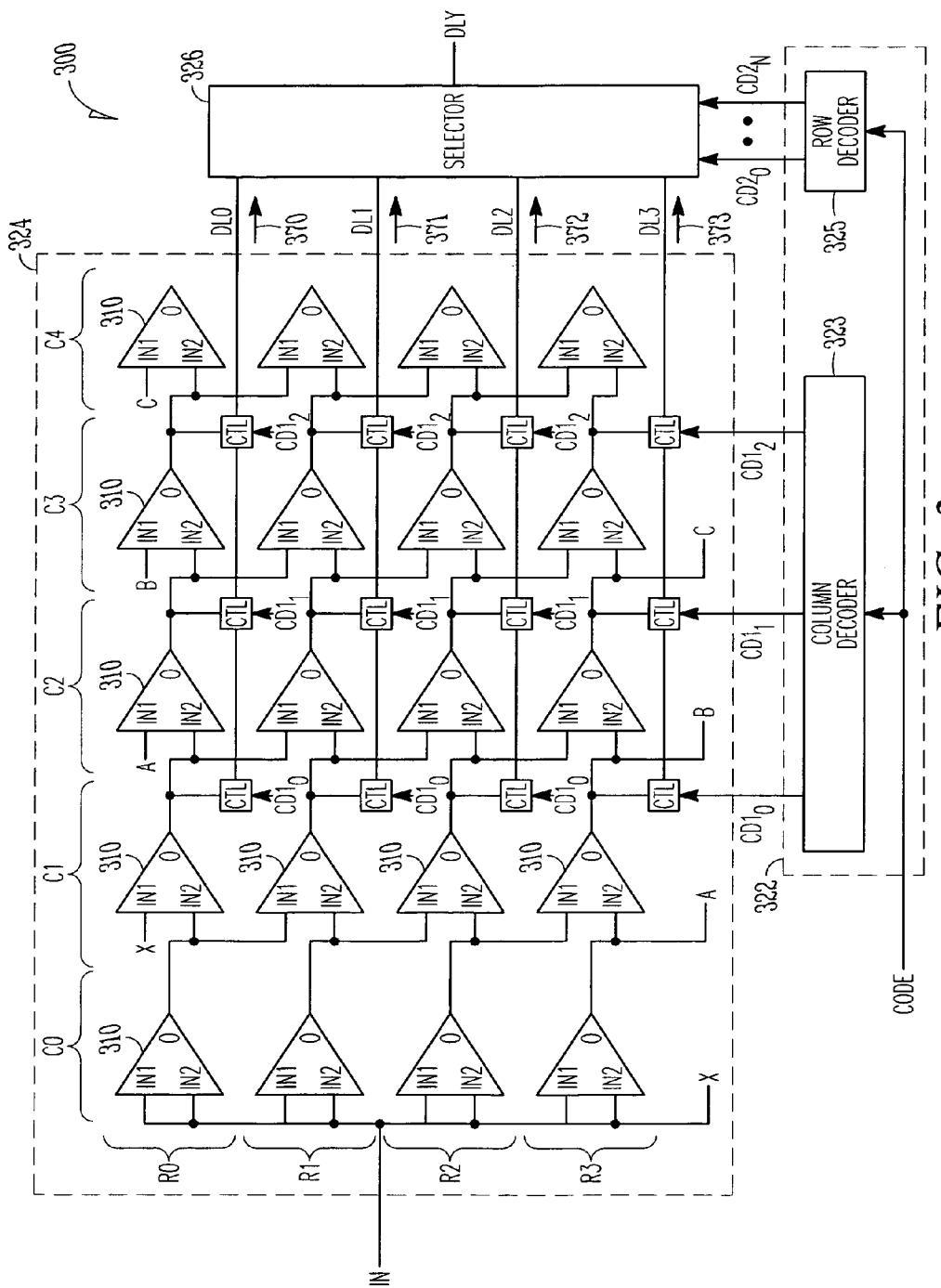
FIG. 3 shows a programmable delayed signal generator according to embodiments of the invention.

FIG. 3 shows a programmable delayed signal generator according to embodiments of the invention. Programmable delayed signal generator 300 receives input signal IN and generates delayed signal DLY based on the IN signal. Programmable delayed signal generator 300 includes decode circuit 322, delay circuit 324, and selector 326.

Decode circuit 322 receives delay code CODE. Column decoder 323 may decode a portion of the CODE to provide a combination of code bits (signals) $CD1_0$, $CD1_1$, and $CD1_2$. Row decoder 325 may decode another portion of the CODE to provide a combination of code bits $CD2_0$ through $CD2_N$. In some embodiments, the CODE is a digital code. Thus, in some embodiments, the combination of the $CD1_0$, $CD1_1$, and $CD1_2$ code bits represents a digital code, and the combination of the $CD2_0$ through $CD2_N$ code bits also represents a digital code.

Delay circuit 324 uses code bits $CD1_0$, $CD1_1$, and $CD1_2$ to select cell output signals (described in subsequent sections below) within delay circuit 324 to be delayed signals DL0, DL1, DL2, and DL3. Selector 326 uses the $CD2_0$ through $CD2_N$ code bits to select one of the signals DL0, DL1, DL2, and DL3 to be delayed signal DLY.

Delay circuit 324 includes a number of delay cells 310 arranged in rows and columns. R0, R1, R2, and R3 indicate the rows. C0, C1, C2, C3, and C4 indicate the columns. The following description uses the rows and columns as coordinates to identify the location of each of the delay cells 310.

Each of the delay cells 310 includes a pair of input nodes IN1 and IN2, and an output node "O". In some embodiments, each delay cell 310 includes a differential amplifier in which input nodes IN1 and IN2 represent the different input nodes of the differential amplifier and output node O represents the output node of the differential amplifier.

In delay circuit 324, the first column C0 serve as load to input circuit 110 to balance inputs to columns C1, C2, and C3 and the last column C4 serve as load to balance columns C1, C2, and C3 such that each delayed signal maintains the same signal swing and rise/fall times. In columns C1, C2, and C3, the output node of one delay cell in one column connects to the input nodes of two succeeding delay cells of the succeeding columns. For example, the output node of the delay cell at C1, R0 connects to input nodes IN2 and IN1 of the delay cells at C2, R0 and at C2, R1. As another example, the output node of the delay cell at C1, R3 connects to input node IN2 of the delay cell at C2, R3 and to input node IN1 of the delay cell of the next column at C3, R0. For clarity, some connections between the delay cells 310 are labeled by letters such as connections labeled by X, A, B, and C. FIG. 3 shows connections of all of the delay cells 310. For simplicity, detailed descriptions of the connections of all of the delay cells 310 are omitted from the description of FIG. 3.

Each delay cell 310 generates a cell output signal at the output node O. All delay cells 310 simultaneously generate the cell output signals at the output nodes of delay cells 310. The cell output signals at the output nodes of delay cells 310 are selectable signals.

The output node of each delay cell in the same row connects to a signal path connected to selector 326. For example, in row R0, the output nodes of all the delay cells in row R0 connect to signal path 370. The DL0 signal represents one of the output signals of the delay cells in row R0. In a similar fashion, the delay cells in each of the rows R1, R2, and R3 connect to one of the signal paths 371, 372, and 373. The DL1 signal represents one of the output signals of the delay cells in row R1. The DL2 signal represents one of the output signals of the delay cells in row R2. The DL3 signal represents one of the output signals of the delay cells in row R3.

Programmable delayed signal generator 300 also includes a number of output control units (CTL) arranged in row and columns corresponding to the rows and columns of delay cells 310. The output control units CLT in the same row select which cell output signal from the delay cells in that row to feed selector 326. For example, the output control units CLT in row R0 select the cell output signal from one of the delay cells in row R0 to be the DL0 signal. As another example, the output control units CLT in row R1 select the cell output signal from one of the delay cells in row R1 to be the DL1 signal.

The output control units CTL may be configured such that the DL0, DL1, DL2, and DL3 signals are selected from the cell output signals of the delay cells in the same column. In some embodiments, the output control units CTL are configured such that each value of the $CD1_0$, $CD1_1$, and $CD1_2$ code bits enables the output control units CTL to allow the cell output signals from only one of the columns C1, C2, and C3 to be the DL0, DL1, DL2, and DL3 signals.

Selector 326 serves as a row multiplexer to select from signals DL0, DL1, DL2, and DL3. Selector 326 uses the $CD2_0$ through $CD2_N$ code bits to select one of the DL0, DL1, DL2, and DL3 signals to be delayed signal DLY. Thus, by setting appropriate values for the $CD1_0$, $CD1_1$, and $CD1_2$ code bits and appropriate values for the $CD2_0$ through $CD2_1$ code bits, the cell output signal from the output node of any one of the delay cells 310 may be selected to be the DLY signal.

For example, to select the cell output signal from the delay cell at C2, R1, the combination of the $CD1_0$, $CD1_1$, and $CD1_2$ code bits may be set to a value (e.g., binary 010) to select the cell output signals from the delay cells of the entire column C2, plus the combination of the $CD2_0$ through $CD2_N$ code bits may be set to a value to select the cell output signal from the delay cell in row R1 of the selected column C2. As another example, to select another cell output signal from another delay cell such as the delay cell at C3, R2, the combination of the $CD1_0$, $CD1_1$, and $CD1_2$ code bits may be set to another value (e.g., binary 001) to select the entire column C3, plus the combination of the $CD2_0$ through $CD2_N$ code bits may be set to another value to select the delay cell in row R2 of the selected column C3.

In FIG. 3, the delay cells in the same row form a delay line. Since column decoder 323 provides the code bits ($CD1_0$, $CD1_1$, and $CD1_2$) to select the cell output signals of the columns, column decoder 323 is a programmable delay-line row decoder. Further, since row decoder 325 provides the code bits ($CD2_0$ through $CD2_N$) to select the signals (DL0, DL1, DL2, and DL3) of the rows, row decoder 325 is a programmable delay-line row decoder.

FIG. 3 shows delay circuit 324 with five columns and four rows of delay cells, as an example. The number of columns may be different from five, and the number of rows of delay cells may be different from four. In some embodiments, each of the $D_{IN}$, IN, DL0, DL1, DL2, DL3, DLY, and $D_{OUT}$ signals includes a pair of differential signals. In some embodiments, programmable delayed signal generator 300 may be used for programmable delayed signal generator 120 of FIG. 1.

Delay circuit 324 with delay cells connected in rows and columns in FIG. 3 may be described as having coupled delay lines.

In FIG. 3, delay circuit 324 provides a delay range in which the value of the delay range depends on the number of the columns, and the resolution of the delay range depends on the number of the rows.

Figure 4:
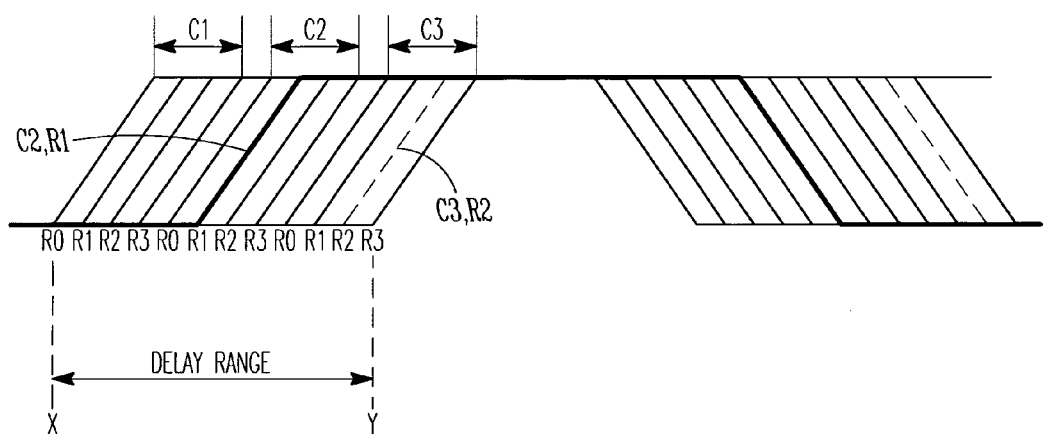
FIG. 4 is a diagram showing delay range and resolution of the delay circuit of FIG. 3.

FIG. 4 is a diagram showing delay range and resolution of the delay circuit of FIG. 3. FIG. 4 shows the cell output signals at output nodes of the delay cells in columns C1, C2, and C3. The signals corresponding to R0, R1, R2, and R3 within each column represent the cell output signals at the delay cells in rows R0, R1, R2, and R3 in each column. FIG. 4 shows that the delay cells form signals with consecutive phase differences (offsets). Since the cell output signals in FIG. 4 are generated based on the IN signal (FIG. 3), the cells output signals in FIG. 4 represent the consecutive phase differences of the IN signal.

The time between X and Y is the delay range, which is the maximum delay achieved by all of the columns. Thus, the delay range is proportional to the number of the columns. The number of the row gives the resolution of the delay range. Thus, the resolution of the delay range is inversely proportional to the number of the rows (the higher the row number, the smaller the delay resolution.)

As described in FIG. 3, each of the cell output signals may be selected by setting an appropriate value for the $CD1_0$, $CD1_1$, and $CD1_2$ code bits and by setting an appropriate value for the $CD2_0$ through $CD2_N$ code bits. For example, a first value of the $CD1_0$, $CD1_1$, and $CD1_2$ code bits and a first value of the $CD2_0$ through $CD2_N$ code bits may select the cell output signal at the output node of delay cell at C2, R1. As another example, a second value of the $CD1_0$, $CD1_1$, and $CD1_2$ code bits and a second value of the $CD2_0$ through $CD2_N$ code bits may select the cell output signal at the output node of delay cell at C3, R2.

Figure 5:
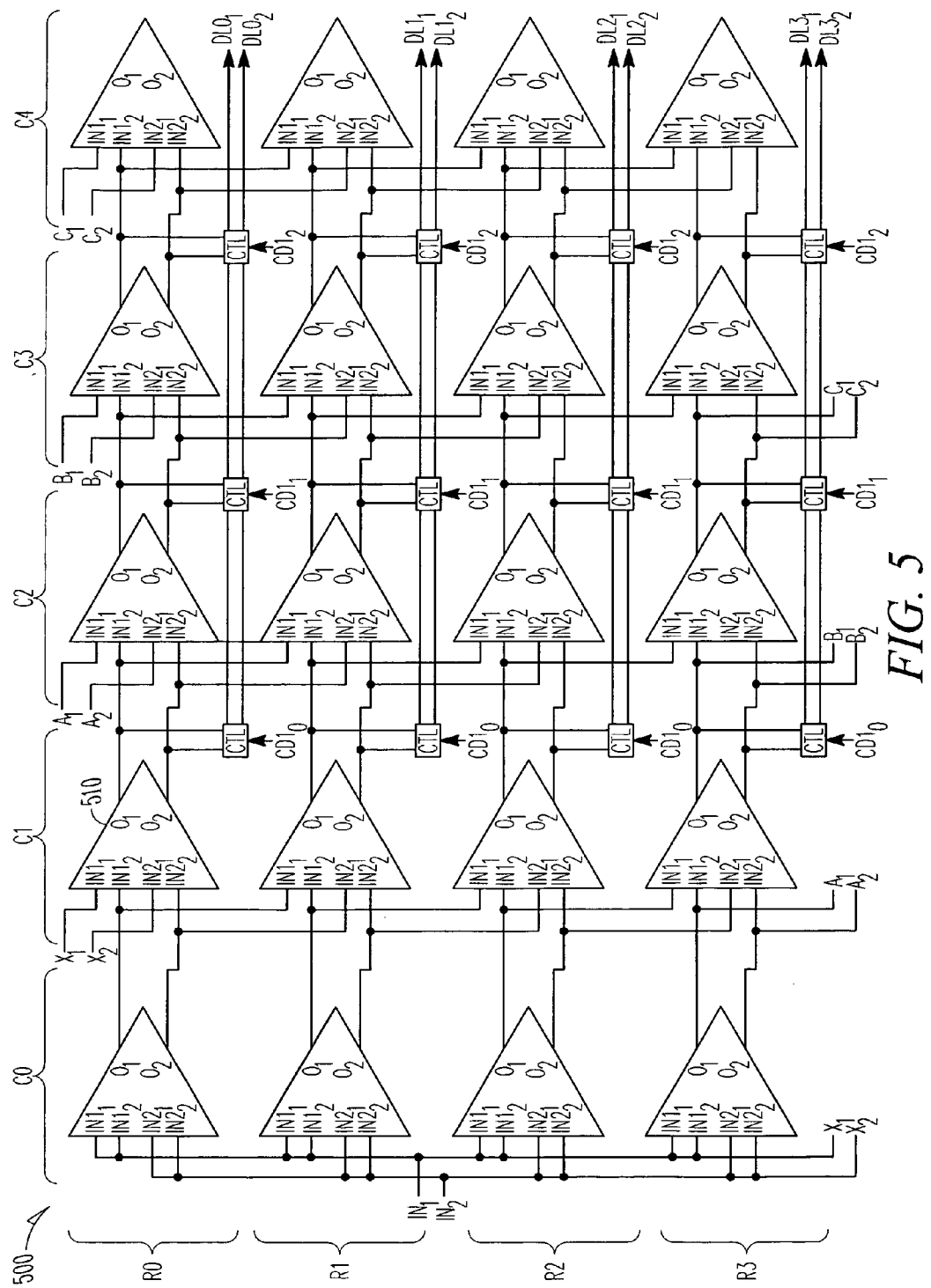
FIG. 5 shows a delay circuit having rows and columns of delay cells with a differential input signal pair and multiple differential delayed signal pairs according to embodiments of the invention.

FIG. 5 shows a delay circuit having rows and columns of delay cells with a differential input signal pair and multiple differential delayed signal pairs according embodiments of the invention. Delay circuit 500 is a variation of delay circuit 300 of FIG. 3. In FIG. 5, delay circuit 500 is a differential circuit to provide an improvement for common mode noise rejection involving supply noise and coupling noise.

Delay circuit 500 receives a differential input signal pair $IN_1$ and $IN_2$ and generates a plurality of differential delayed signal pairs $DL0_1$ and $DL0_2$, $DL1_1$ and $DL1_2$, $DL2_1$ and $DL2_2$, and $DL3_1$ and $DL3_2$. In some embodiments, delay circuit 500 may be used for delay circuit 124 of FIG. 1 or delay circuit 324 of FIG. 3. In these embodiments, the differential input signal pair $IN_1$ and $IN_2$ represents a differential form of the IN signal, differential delayed signal pairs $DL0_1$ and $DL0_2$, $DL1_1$ and $DL1_2$, $DL2_1$ and $DL2_2$, and $DL3_1$ and $DL3_2$ represent differential forms of the DL0, DL1, DL2, and DL3 signals, respectively. that the differential form includes a signal pair (two signals) in which a first signal of the signal pair has a first signal level and a second signal of the signal pair has a second signal level different from the first signal level.

Delay circuit 500 includes a number of delay cells 510 arranged in rows and columns. R0, R1, R2, and R3 indicate the rows. C0, C1, C2, C3, and C4 indicate the columns. The following description uses the rows and columns as coordinates to identify the locations of each of the delay cells 510.

Each of the delay cells 510 includes a first input node pair $IN1_1$ and $IN1_2$, a second input node pair $IN2_1$ and $IN2_2$, and an output node pair $O_1$ and $O_2$. Each delay cell 510 includes a differential amplifier with dual input node pairs in which the first input node pair $IN1_1$ and $IN1_2$ is located on one side of the differential amplifier, the second input node pair $IN2_1$ and $IN2_2$ is located on another side of the differential amplifier, and the output node pair $O_1$ and $O_2$ are the output nodes of the differential amplifier.

An example of a differential amplifier with dual input node pairs is disclosed in U.S. patent application Ser. No. 10/748,300 filed on Dec. 31, 2003.

In delay circuit 500, the last column C4 serves as load to balance columns C1, C2, and C3. In columns C1, C2, and C3, each output node of one delay cell in one column connects to the input nodes of two succeeding delay cells of the succeeding columns. For example, the output node $O_1$ of the delay cell at C1, R0 connects to input nodes $IN1_2$ and $IN1_1$ of the delay cells at C2, R0 and at C2, R1; the output node $O_2$ of the delay cell at C1, R0 connects to input nodes $IN2_2$ and $IN2_1$ of the delay cells at C2, R0 and at C2, R1. For clarity, some connections between the delay cells 510 are indicated by alphanumerical labels $X_1$, $X_2$, $A_1$, $A_2$, $B_1$, $B_2$, $C_1$, and $C_2$. FIG. 5 shows connections of all of the delay cells 510. For simplicity, detailed descriptions of the connections of all of the delay cells 510 are omitted from the description of FIG. 5.

Each delay cell 510 generates a cell output signal pair at output nodes $O_1$ and $O_2$. All delay cells 510 simultaneously generate the cell output signal pairs at the output nodes of delay cells 510. The cell output signals at the output nodes of delay cells 510 are selectable signals.

Delay 500 also includes a number of output control units (CTL) arranged in rows and columns corresponding to the rows and column of delay cells 510. The output control units CLT in the same row select which cell output signals from the delay cells in the same row will be the differential delayed signal pair in that row. For example, the output control units CLT in row R0 select the output signals from one of the delay cells in row R0 to be the differential delayed signal pair $DL0_1$ and $DL0_2$. As another example, the output control units CLT in row R1 select the output signals from one of the delay cells in row R1 to be the differential delayed signal pair $DL1_1$ and $DL1_2$.

The output control units CTL may be configured such that the differential delayed signal pairs $DL0_1$ and $DL0_2$, $DL1_1$ and $DL1_2$, $DL2_1$ and $DL2_2$, and $DL3_1$ and $DL3_2$ are selected from the output signals of the delay cells in the same column. The selection of the output control units CTL are based on the value of a number of code bits $CD1_0$, $CD1_1$, and $CD1_2$. The code bits $CD1_0$, $CD1_1$, and $CD1_2$ are programmable code bits similar to the code bits described in FIG. 3.

In some embodiments, the output control units CTL are configured such that each value of the $CD1_0$, $CD1_1$, and $CD1_2$ code bits enables the output control units CTL to allow the cell output signals from only one of the columns C1, C2, and C3 to be the differential delayed signal pairs $DL0_1$ and $DL0_2$, $DL1_1$ and $DL1_2$, $DL2_1$ and $DL2_2$, and $DL3_1$ and $DL3_2$.

In some embodiments, delay circuit 500 is used in a programmable delayed signal generator such as programmable delayed signal generator 120 of FIG. 1 or programmable delayed signal generator 300 of FIG. 3. In these embodiments, a selector of the programmable delayed signal generator such as selector 126 of FIG. 1 or selector 326 of FIG. 2 selects one of the differential delayed signal pairs $DL0_1$ and $DL0_2$, $DL1_1$ and $DL1_2$, $DL2_1$ and $DL2_2$, and $DL3_1$ and $DL3_2$ to be a selected differential delayed signal pair. For example, selector 326 may be used with delay circuit 500 of FIG. 5 to select one of the differential delayed signal pairs $DL0_1$ and $DL0_2$, $DL1_1$ and $DL1_2$, $DL2_1$ and $DL2_2$, and $DL3_1$ and $DL3_2$ to be a differential form of the DLY signal in FIG. 3.

Delay circuit 500 provides a delay range and a resolution. The number of columns (e.g., C0, C2, and C3) provides the delay range. The number of rows (R0, R1, R2, R3, and R4) provides the resolution.

Embodiments exist where delay circuit 500 is constructed such that the timing of the resolution is less than a delay of each of the delay cells 510. For example, each of the delay cells 510 may be constructed with an embodiment of a delay cell disclosed in the above-mentioned U.S. patent application Ser. No. 10/748,300 to provide a delay range with a two-picosecond resolution in modern CMOS technology. Thus, in some embodiments, the delay or phase difference between consecutive pairs of the differential delayed signal pairs $DL0_1$ and $DL0_2$, $DL1_1$ and $DL1_2$, $DL2_1$ and $DL2_2$, and $DL3_1$ and $DL3_2$ is two picoseconds. When used in timing delay injector 100 of FIG. 1, the two-picosecond resolution of delay circuit allows timing delay injector 100 to provide a delay range with a higher resolution. Further, the high resolution allows delay circuit 500 to be used in a device operating at high frequency such as a frequency of about ten gigahertz (10 GHz).

Delay circuit 500 with delay cells connected in rows and columns as shown in FIG. 5 may be described as having coupled delay lines.

Figure 6:
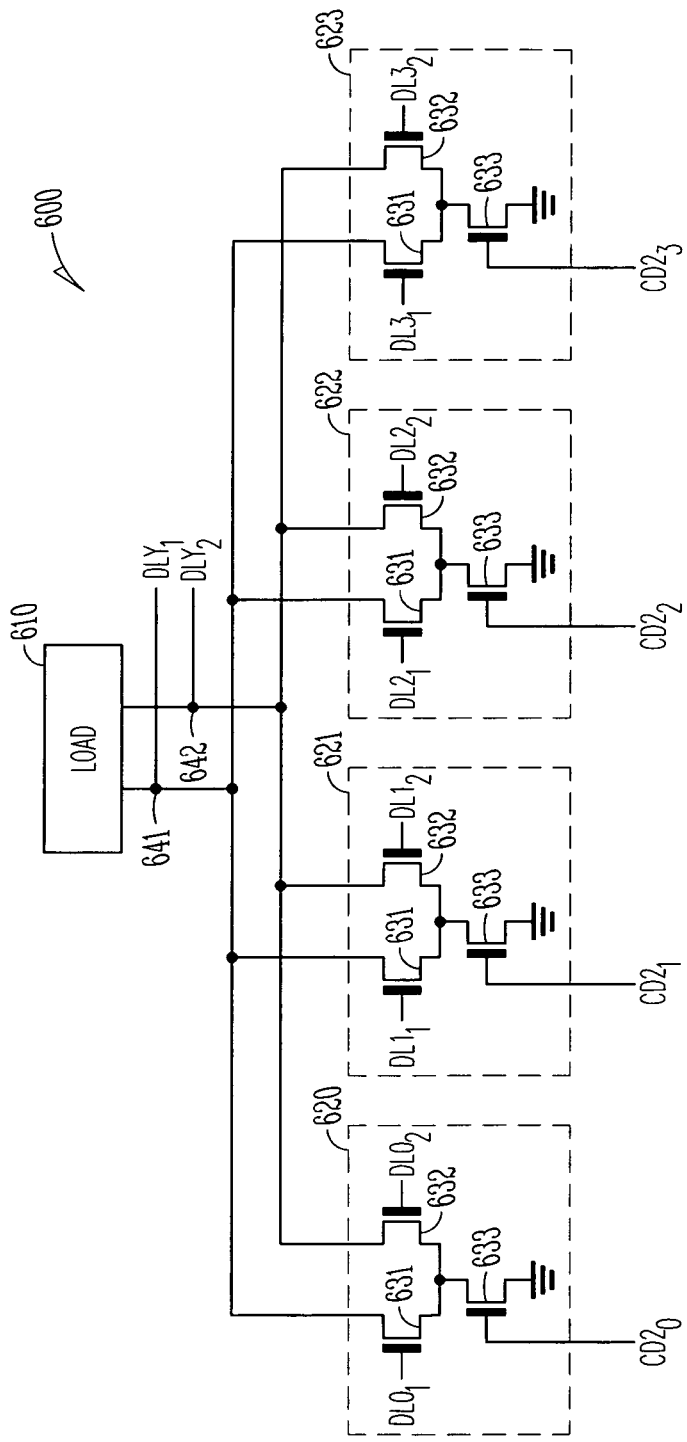
FIG. 6 shows a selector according to embodiments of the invention.

FIG. 6 shows a selector according to embodiments of the invention. Selector 600 includes a load 610, a number of input stages 620-623 (620, 621, 622, and 623), and a pair of output nodes 641 and 642 shared by load 610 and all input stages 620-623. In some embodiments, load 610 is a resistive load. In other embodiments, load 610 is a current-controlled load. In some other embodiments, load 610 is a combination of inductive and resistive loads.

Selector 600 provides output signals $DLY_1$ and $DLY_2$ at output nodes 641 and 642, respectively. The $DLY_1$ and $DLY_2$ signals are a differential signal pair. The timing of the $DLY_1$ and $DLY_2$ signals depends on which one of the input stages 620-623 is activated. Selector 600 uses a combination of code bits $CD2_0$, $CD2_1$, and $CD2_2$, and $CD2_3$ to activate input stages 620-623. A different value of the $CD2_0$, $CD2_1$, $CD2_2$, and $CD2_3$ code bits activates one of the input stages and deactivates all of the other input stages. For example, a binary value 0100 of the code bits $CD2_0$, $CD2_1$, and $CD2_2$, and $CD2_3$ activates input stage 621 and deactivates input stages 620, 622, and 623.

Each of the input stages includes a pair of transistors 631 and 632 to receive an input signal pair, and each input stages further includes current source 633 controlled by one of the code bits $CD2_0$, $CD2_1$, and $CD2_2$, and $CD2_3$. Input stage 620 receives signal pair $DL0_1$ and $DL0_2$. Input stage 621 receives signal pair $DL1_1$ and $DL1_2$. Input stage 622 receives signal pair $DL2_1$ and $DL2_2$. Input stage 623 receives signal pair $DL3_1$ and $DL3_2$. Each of the input signal pairs $DL0_1$ and $DL0_2$, $DL1_1$ and $DL1_2$, $DL2_1$ and $DL2_2$, and $DL3_1$ and $DL3_2$ is a differential signal pair.

Since all input stages 620-623 share the same output nodes 641 and 642, the timing of the $DLY_1$ and $DLY_2$ signals at output nodes 641 and 642 depends on the timing of the input signal pair of the activated input stage. For example, the timing of the $DLY_1$ and $DLY_2$ signals depends on the timing of the $DL1_1$ and $DL1_2$ signals when input stage 621 is activated.

In some embodiments, the input signal pairs $DL0_1$ and $DL0_2$, $DL1_1$ and $DL1_2$, $DL2_1$ and $DL2_2$, and $DL3_1$ and $DL3_2$ have a different delay from one another relative to a signal pair such as the signal pair $IN_1$ and $IN_2$ of FIG. 5. Since the timing of the $DLY_1$ and $DLY_2$ signals depends on which one of the input stages 620-623 is activated, different $DLY_1$ and $DLY_2$ signals with a different delay relative to a signal pair such as the signal pair $IN_1$ and $IN_2$ of FIG. 6 may be obtained by setting different values for the code bits $CD2_0$, $CD2_1$, and $CD2_2$, and $CD2_3$.

In some embodiments, selector 600 is used in combination with a delay circuit such as delay circuit 500 of FIG. 5. In these embodiments, the input signal pairs $DL0_1$ and $DL0_2$, $DL1_1$ and $DL1_2$, $DL2_1$ and $DL2_2$, and $DL3_1$ and $DL3_2$ of FIG. 6 represent the differential delayed signal pairs $DL0_1$ and $DL0_2$, $DL1_1$ and $DL1_2$, $DL2_1$ and $DL2_2$, and $DL3_1$ and $DL3_2$ of FIG. 5.

The construction of selector 600 allows selector 600 to be used in a device that operates at a high frequency without using a combination of multiple two-to-one multiplexers to select the input signal pairs $DL0_1$ and $DL0_2$, $DL1_1$ and $DL1_2$, $DL2_1$ and $DL2_2$, and $DL3_1$ and $DL3_2$.

In some embodiments, selector 600 may be used for selector 126 of FIG. 1 or selector 326 of FIG. 3.

Figure 7:
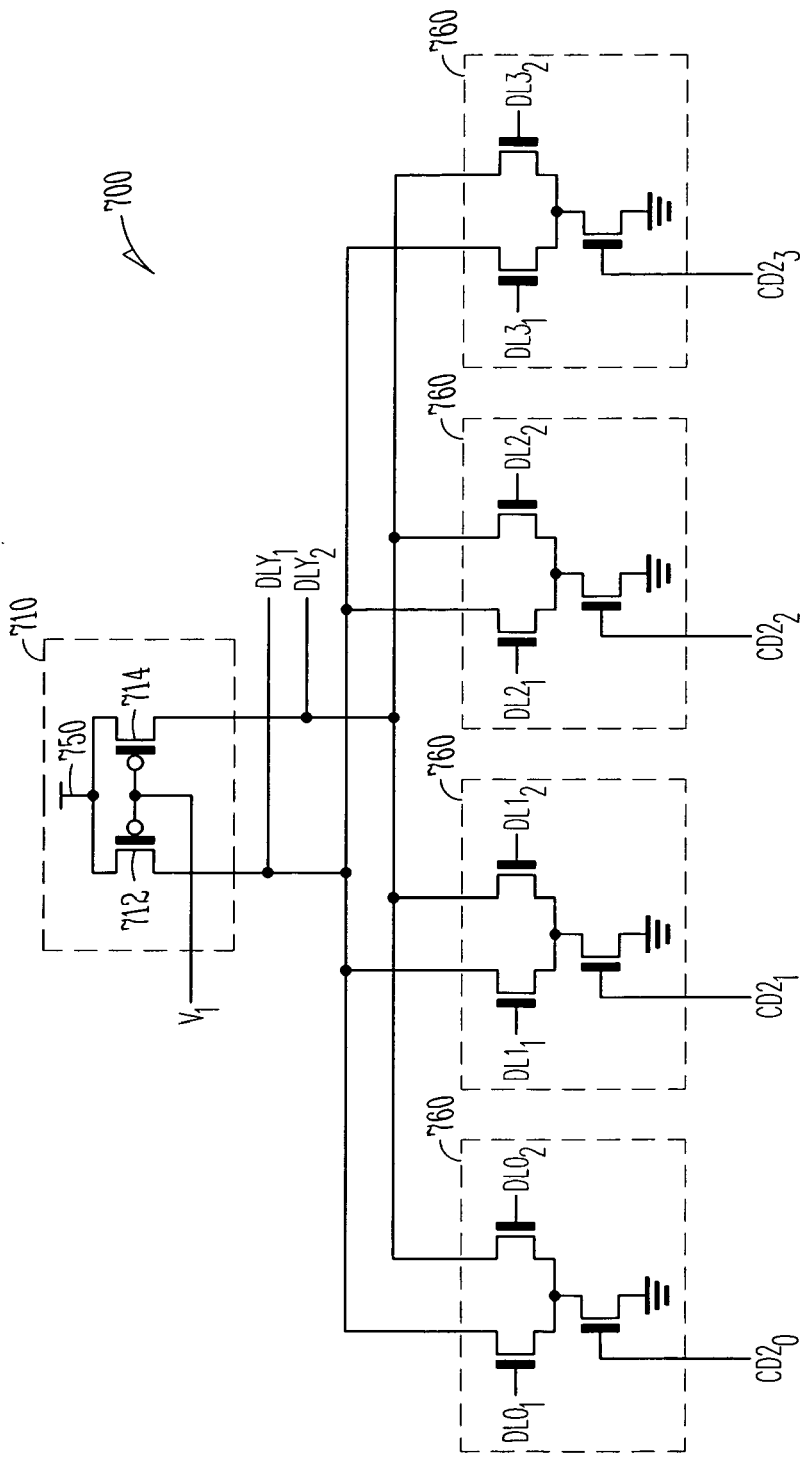
FIG. 7, FIG. 8, and FIG. 9 show variations of the selector of FIG. 6 according to embodiments of the invention.
Figure 8:
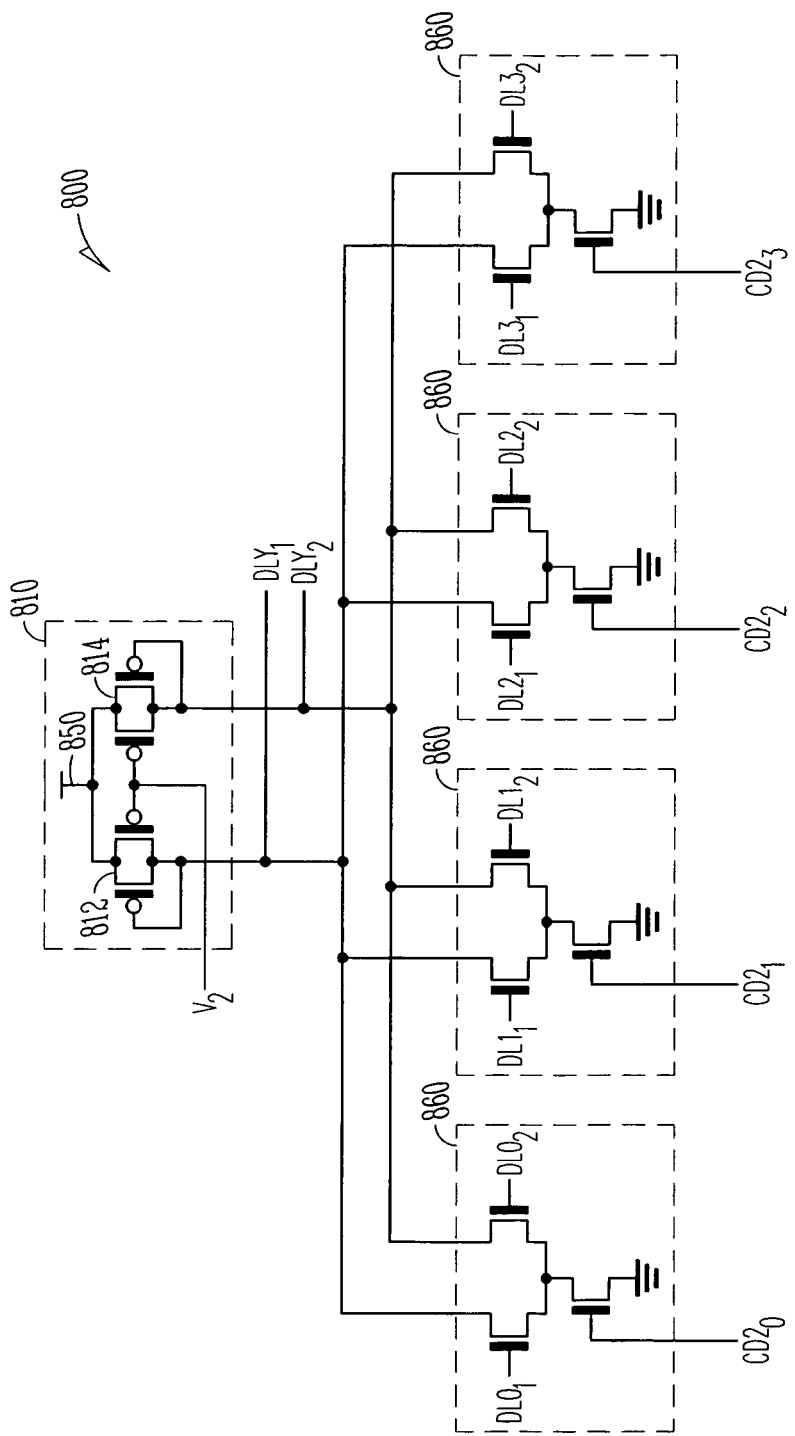
Figure 9:
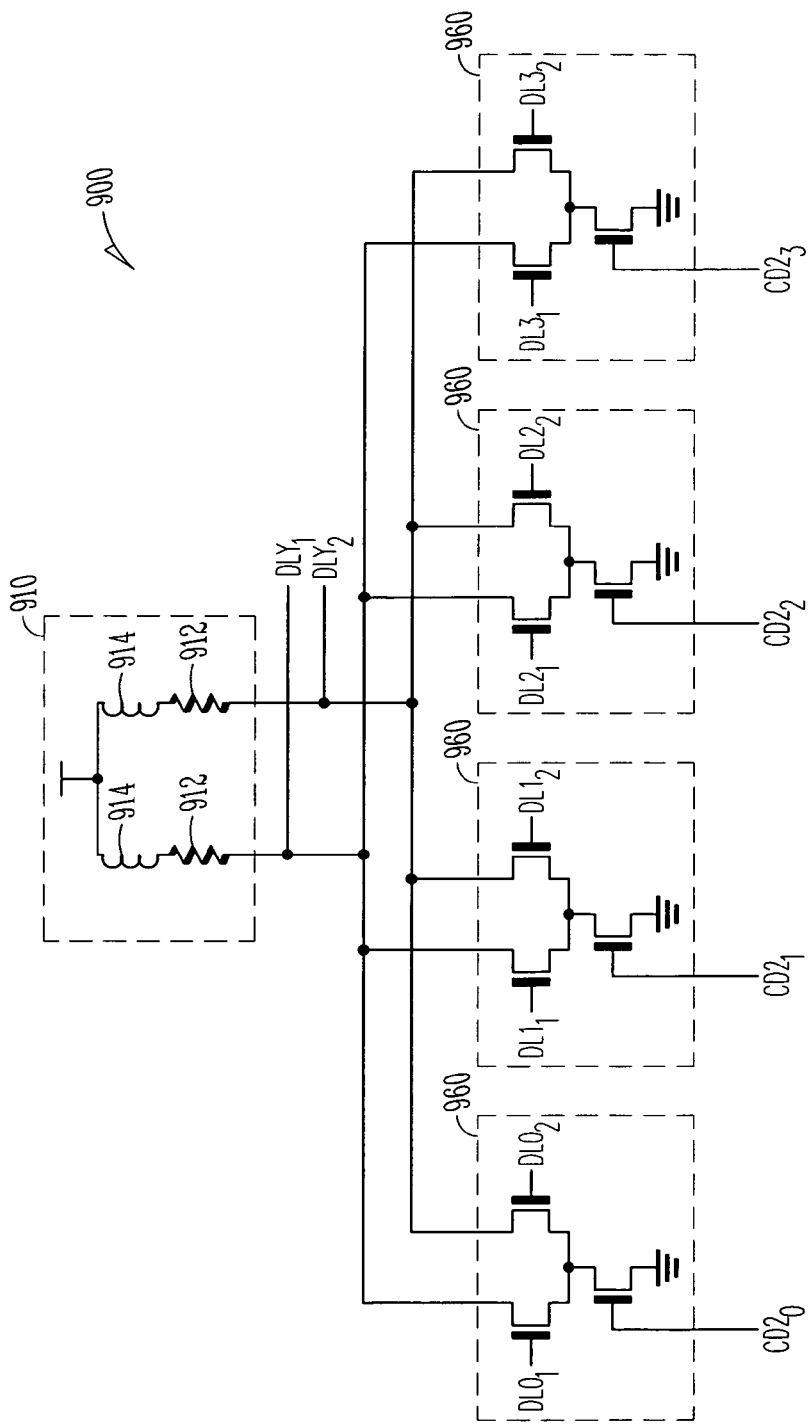

FIG. 7, FIG. 8, and FIG. 9 show some exemplary variations of the selector of FIG. 6.

In FIG. 7, selector 700 includes a load 710 formed by transistors 712 and 714. A bias voltage V1 controls the gates of transistors 712 and 714 to provide appropriate loading between a supply node 750 and input stages 760.

In FIG. 8, selector 800 includes a load 810 formed by a symmetrical arrangement of transistor pairs 812 and 814. A bias voltage V2 controls transistor pairs 812 and 814 to provide appropriate loading between a supply node 850 and input stages 860. The symmetrical arrangement of transistor pairs 812 and 814 provides an improved linearity of the resistive loads, which results in an improved signal integrity in the $DLY_1$ and $DLY_2$ signals.

In FIG. 9, selector 900 includes input stages 960 and a load 910 formed by resistors 912 and inductors 914. The combination of resistors 912 and inductors 914 improves the slew rate of the $DLY_1$ and $DLY_2$ signals.

In some embodiments, any one of the selectors 700, 800, and 900 may be used for selector 126 of FIG. 1 or selector 326 of FIG. 3.

Figure 10:
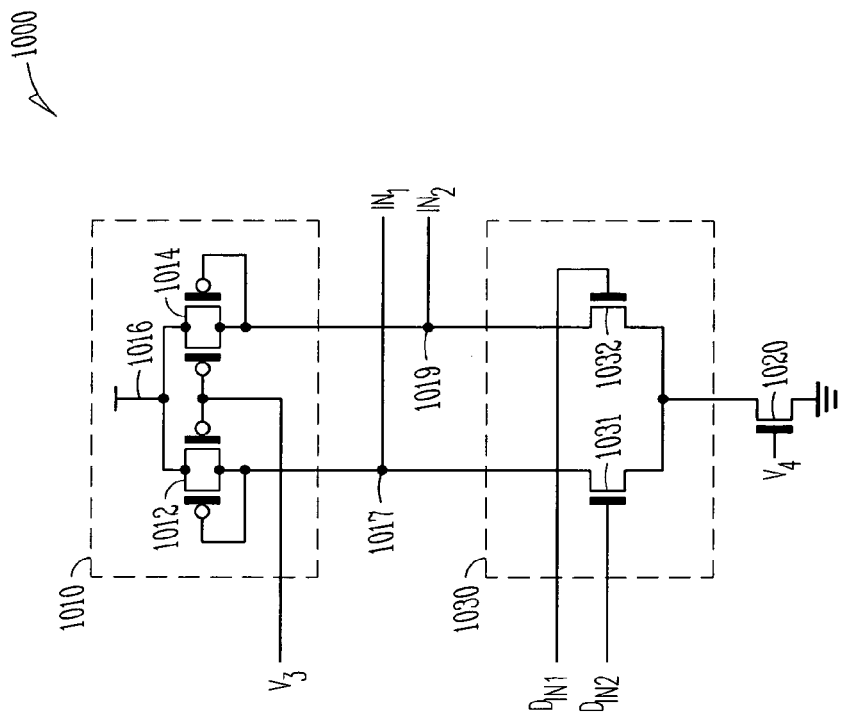
FIG. 10 shows an input circuit according to embodiments of the invention.

FIG. 10 shows an input circuit according to embodiments of the invention. Input circuit 1000 receives input signals $D_{IN1}$ and $D_{IN2}$ and generates a signal pair $IN_1$ and $IN_2$. Input circuit 1000 includes a load 1010 formed by transistor pairs 1012 and 1014, current source 1020, and switching circuit 1030 formed by transistors 1031 and 1032. A first bias signal V3 controls transistor pairs 1012 and 1014. A second bias signal V4 controls current source 1020.

Input circuit 1000 operates as a current mode logic differential amplifier. Input signals $D_{IN1}$ and $D_{IN2}$ are a differential signal pair. Output signals $IN_1$ and $IN_2$ at output nodes 1017 and 1019, respectively, are a differential signal pair. The signal swing of the $IN_1$ and $IN_2$ signals may be chosen to be within a signal swing range by selecting the values of bias signals V3 and V4.

In some embodiments, V3 and V4 may be selected to provide the $IN_1$ and $IN_2$ signals with a low voltage swing range such that input circuit 1000 is suitable for a relatively high frequency and low power operation.

Further, transistor pairs 1012 and 1014 are arranged symmetrically between supply node 1016 and output nodes 1017 and 1019, so that load 1010 is a symmetrical load. A symmetrical load provides an improved rejection of power supply noise; as a result, the signal-to-noise ratio of the $IN_1$ and $IN_2$ signals is improved.

In some embodiments, input circuit 1000 may be used for input circuit 110 of FIG. 1 such that the differential signal pair $D_{IN1}$ and $D_{IN2}$ of FIG. 10 represents the differential form of the $D_{IN}$ signal of FIG. 1, while the differential signal pair $IN_1$ and $IN_2$ of FIG. 10 represents the differential form of the IN signal of FIG. 1.

In other embodiments, the differential signal pair $IN_1$ and $IN_2$ of FIG. 10 feeds a delay circuit, such as delay circuit 324 of FIG. 3, such that the differential signal pair $IN_1$ and $IN_2$ of FIG. 10 represents the differential form of the IN signal of FIG. 3.

In some other embodiments, the differential signal pair $IN_1$ and $IN_2$ of FIG. 10 feeds a delay circuit, such as delay circuit 500 of FIG. 5, such that the differential signal pair $IN_1$ and $IN_2$ of FIG. 10 represents the differential signal pair $IN_1$ and $IN_2$ of FIG. 5.

Figure 11:
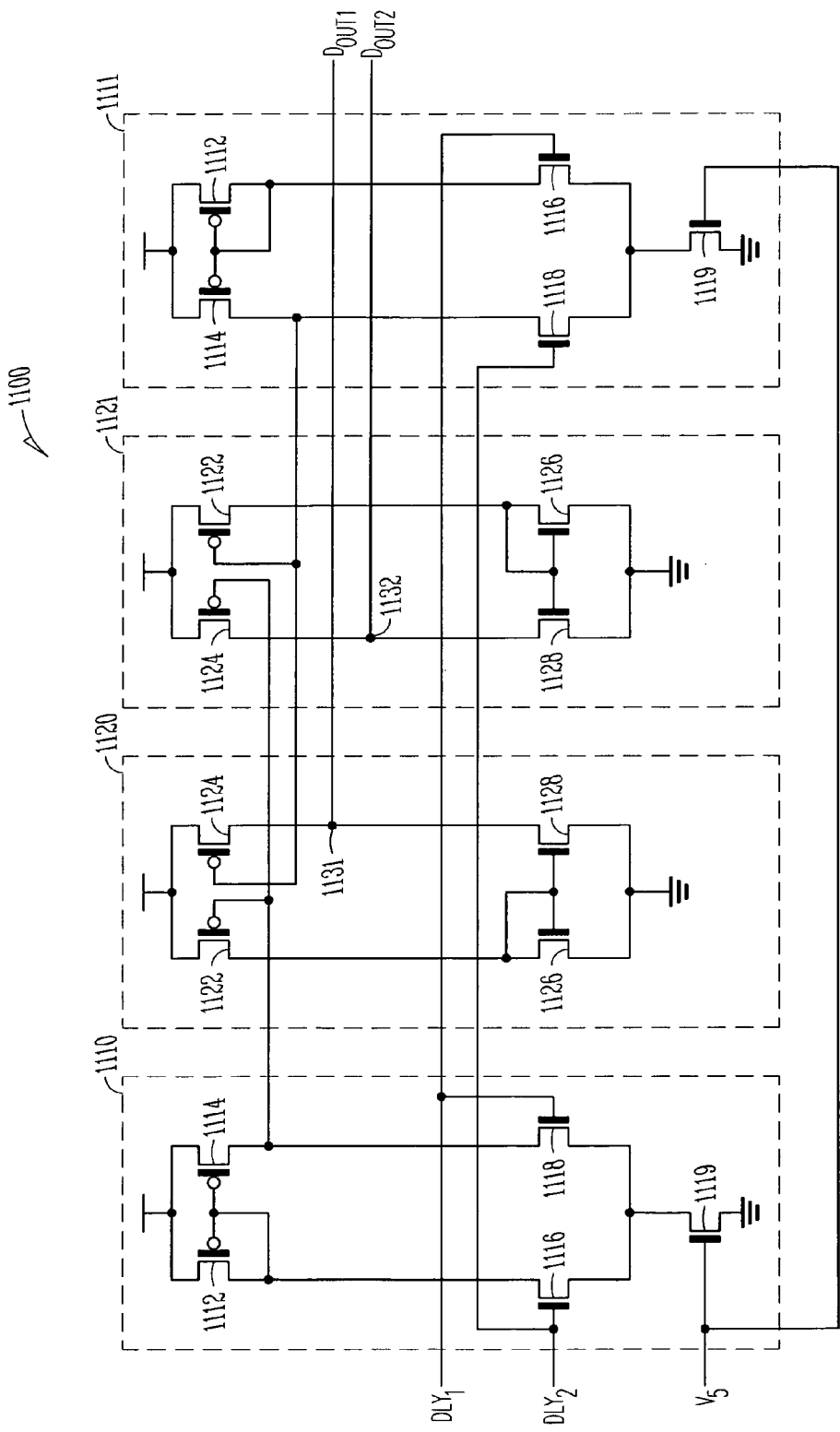
FIG. 11 shows an output circuit according to embodiments of the invention.

FIG. 11 shows an output circuit according to embodiments of the invention. Output circuit 1100 receives a differential delayed signal pair $DLY_1$ and $DLY_2$ and generates a different output signal pair $D_{OUT1}$ and $D_{OUT2}$. Output circuit 1100 includes an input unit formed by input stages 1110 and 1111, and an output unit formed by output stages 1120 and 1121. Input stages 1110 and 1111 are mirrored input stages. Output stages 1120 and 1121 are mirrored output stages. Mirrored input stages and mirror output stages provide a symmetrical structure for output circuit 1100. Symmetrical structure improves the performance of output circuit 1100.

Each of the input stages 1110 and 1111 includes a load formed by transistors 1112 and 1114, a pair of input transistors 1116 and 1118 to receive the $DLY_1$ and $DLY_2$ signals, respectively, and current source 1119. Bias signal V5 controls current source 1119 of both input stages 1110 and 1111. The value of the V5 signal may be selected such that the transistors of current sources 1119 operate in saturation mode.

Each of output stages 1120 and 1121 includes a load formed by transistors 1122 and 1124, and each output stage further includes a current mirror formed by transistors 1126 and 1128. Output stage 1120 includes output node 1131 to provide the $D_{OUT1}$ signal. Output stage 1121 includes output node 1132 to provide the $D_{OUT2}$ signal.

Input stages 1110 and 1111 operate as current mode logic with tail current provided by current sources 1119. Current mode logic is suitable for high frequency operation. Output stages 1120 and 1121 operate as differential amplifiers. In some embodiments, output stages 1120 and 1121 convert the $DLY_1$ and $DLY_2$ signals having a low signal swing to signals $D_{OUT1}$ and $D_{OUT2}$ having a higher signal swing such as a rail-to-rail voltage swing (e.g., Vcc and ground, where Vcc is the supply voltage of output circuit 1100). The current mode logic and mirrored structure of output circuit 1100 allow output circuit 1110 to be useful for high frequency operation.

In some embodiments, output circuit 1100 may be used for output circuit 130 of FIG. 1 such that the differential delayed signal pair $DLY_1$ and $DLY_2$ of FIG. 11 represents the differential form of the DLY signal of FIG. 1, while the differential output signal pair $D_{OUT1}$ and $D_{OUT2}$ of FIG. 11 represents the differential form of the $D_{OUT}$ signal of FIG. 1.

In other embodiments, output circuit 1100 is used in combination with a signal generator, such as programmable delayed signal generator 300 of FIG. 3. In these embodiments, the differential delayed signal pair $DLY_1$ and $DLY_2$ of FIG. 11 represents the differential form of the DLY signal of FIG. 3.

Figure 12:
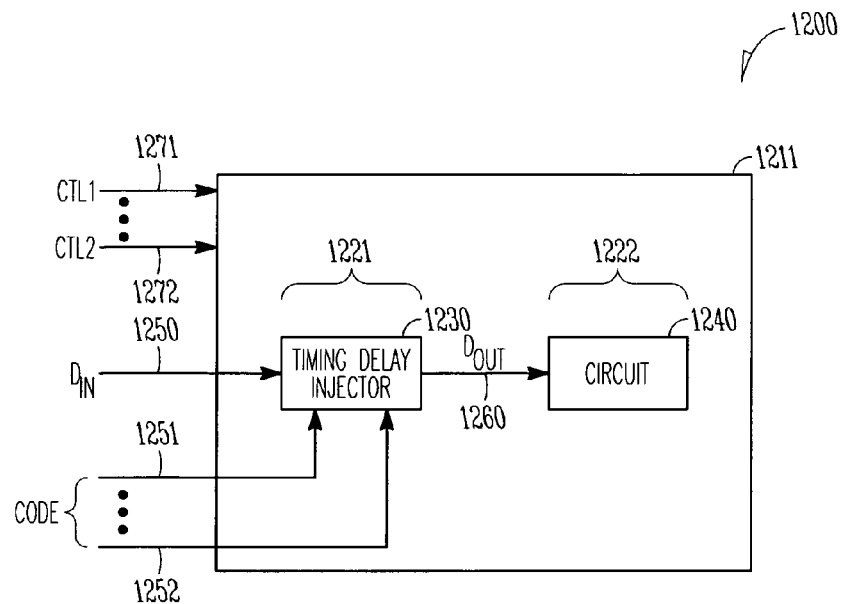
FIG. 12 shows a device having an on-die timing delay injector according to embodiments of the invention.

FIG. 12 shows a device having an on-die timing delay injector according to embodiments of the invention. Device 1200 includes substrate 1211. Substrate 1211 includes an integrated circuit die. In some embodiments, substrate 1211 includes monolithic semiconductor material. In some embodiments, the monolithic semiconductor material includes silicon. Substrate 1211 includes a first substrate area 1221 and a second substrate area 1222.

Device 1200 further includes a timing delay injector 1230 formed on substrate area 1221, and a circuit 1240 formed on substrate area 1222. Since both timing delay injector 1230 and circuit 1240 are formed on the same substrate or the same die 1211, timing delay injector 1220 of device 1200 is an on-die timing delay injector.

Device 1200 further includes a number of lines 1250, 1251, 1252, 1271, and 1272. In some embodiments, lines 1250, 1251, 1252, 1271, and 1272 correspond to external terminals or external connections of device 1200. In other embodiments, lines 1250, 1251, 1252, 1271, and 1272 correspond to pins or solder balls on a packaged integrated circuit of device 1200. In some other embodiments, lines 1250, 1251, 1252, 1271, and 1272 correspond to contact pads on die 1211 of device 1200.

Timing delay injector 1230 receives an input signal $D_{IN}$ from line 1250. In some embodiments, $D_{IN}$ has a differential form such that the $D_{IN}$ signal includes a differential signal pair. In embodiments where $D_{IN}$ signal includes a differential signal pair, the differential signal pair is provided on a pair of lines. In some embodiments, timing delay injector 1230 receives the $D_{IN}$ signal from an internal source of device 1200 in which the $D_{IN}$ signal is provided to timing delay injector 1230 via an internal line different from line 1250.

Timing delay injector 1230 generates output signal $D_{OUT}$ based on the $D_{IN}$ signal. In some embodiments, the $D_{OUT}$ signal has a differential form such that the $D_{OUT}$ signal includes a differential signal pair. In embodiments where $D_{OUT}$ includes a differential signal pair, the differential signal pair is provided on a pair of lines.

Timing delay injector 1230 receives a delay code CODE on lines 1251 through 1252 to control the timing of the $D_{OUT}$ signal. The value of the CODE may be selected to choose the timing of the $D_{OUT}$ signal. Timing delay injector 1230 includes embodiments of timing delay injector 100 and other circuits described in FIG. 1 through FIG. 11. Thus, in FIG. 12, a different $D_{OUT}$ signal with a different delay relative to the $D_{IN}$ signal may be obtained by setting an appropriate value for the CODE in FIG. 12.

In some embodiments, the value of the CODE is set such that the $D_{OUT}$ signal has a fixed delay relative to the $D_{IN}$, so that the $D_{OUT}$ signal of timing delay injector 1230 is suitable for use as a timing signal or control signal in circuit 1240.

In other embodiments, timing delay injector 1230 generates different $D_{OUT}$ signals with different delays from one another with respect to the $D_{IN}$ signal, so that the different $D_{OUT}$ signals may be used to evaluate a performance of circuit 1240. For example, circuit 1340 may be a clock recovery circuit, and timing delay injector 1230 may generate different $D_{OUT}$ signals to evaluate the clock recovery circuit with the different $D_{OUT}$ signals.

In some other embodiments, circuit 1240 includes an optical link transceiver in which timing delay injector 1230 generates different $D_{OUT}$ signals with different delays from one another with respect to the $D_{IN}$ signal, so that the different $D_{OUT}$ signals may be used to evaluate the optical link transceiver of circuit 1240.

Device 1200 responds to control signals CTL1 and CTL2 on lines 1271 and 1272. In some embodiments, device 1200 responds to CTL1 signal to allow timing delay injector 1230 to receive the $D_{IN}$ signal to generate the $D_{OUT}$ signal with a delay set by the value of the CODE. In these embodiments, the $D_{OUT}$ signal feeds circuit 1240. In other embodiments, device 1200 responds to the CTL2 signal to deactivate timing delay injector 1230 such that timing delay injector 1200 is inoperative. In some embodiments, the $D_{IN}$ signal bypasses timing delay injector 1230 such that the $D_{IN}$ signal feeds circuit 1240 from line 1250 directly to line 1260 when timing delay injector 1230 is inoperative. In some embodiments, device 1200 responds to the CLT1 signal during an evaluation of circuit 1240. In some embodiments, the evaluation of circuit 1240 is performed during a test of device 1200.

Figure 13:
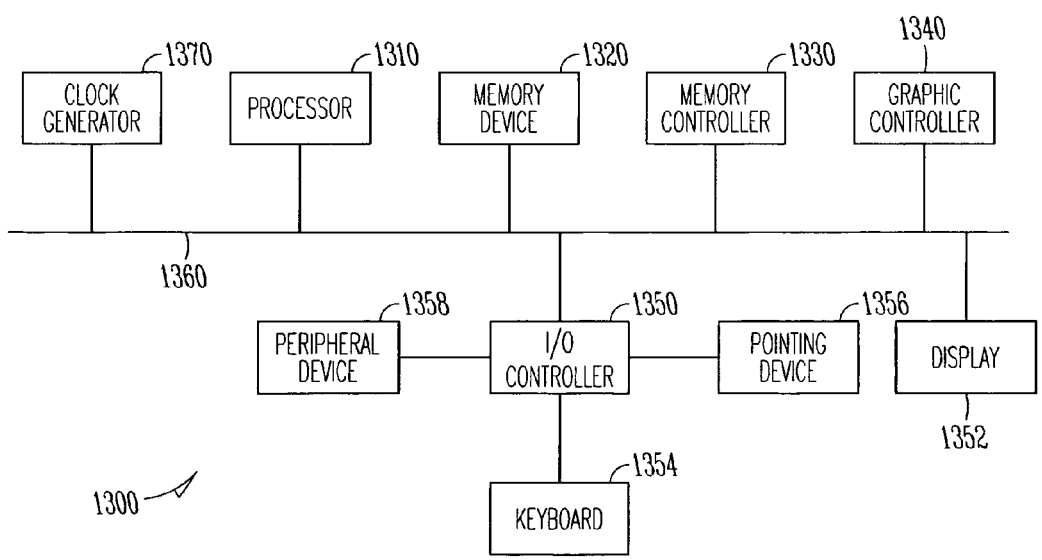
FIG. 13 shows an electronic system according to embodiments of the invention.

FIG. 13 shows an electronic system according to embodiments of the invention. System 1300 includes at least one processing unit or processor 1310, memory device 1320, memory controller 1330, graphic controller 1340, input and output (I/O) controller 1350, display 1352, keyboard 1354, pointing device 1356, and peripheral device 1358. Bus 1360 connects all of these devices together. Clock circuit 1370 provides a clock signal to at least one of the devices of system 1300. In some embodiments, system 1300 may omit one or more devices shown in FIG. 13. In some embodiments, two or more devices shown in system 1300 may be formed on a single chip.

Bus 1360 may be conducting traces on a circuit board or may be one or more cables. Bus 1360 may also connect the devices of system 1300 by wireless means such as electromagnetic radiation (e.g., radio waves). Bus 1360 may further include at least one optical link connection to at least one of the devices shown in FIG. 13 to provide a signal to an optical link transceiver of at least one of the devices through the optical link. Peripheral device 1358 may be a printer, an optical device (e.g., a compact disc read only memory (CD-ROM) device or a digital video disc (DVD) device), a magnetic device (e.g., floppy disk driver), or an audio device (e.g., a microphone). Memory device 1320 may comprise a dynamic random access memory (DRAM) device, a static random access memory (SRAM) device, a flash memory device, or a combination thereof.

At least one of the devices shown in system 1300 includes embodiments of FIG. 1 through FIG. 12. Thus, at least one of the devices shown in system 1300 includes embodiments of a timing delay injector described in FIG. 1 through FIG. 12, including device 1200 with on-die timing delay injector 1230 of FIG. 12.

System 1300 may take the form of computers (e.g., desktops, laptops, handhelds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 14:
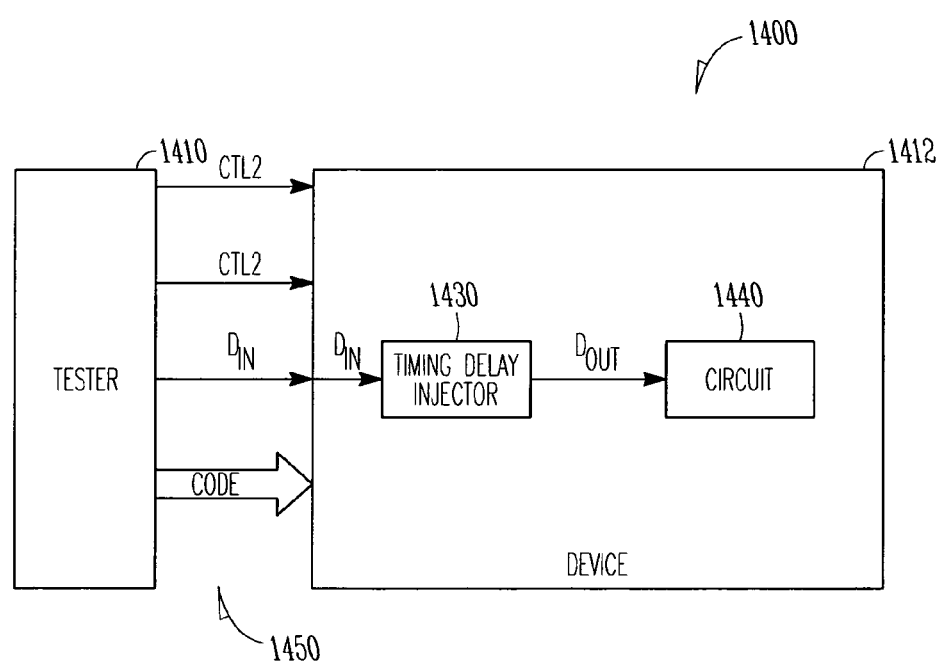
FIG. 14 shows a test system according to embodiments of the invention.

FIG. 14 shows a test system according to embodiments of the invention. Test system 1400 includes tester 1410 and device 1412. Tester 1410 may be a computer. Device 1412 may be a processor, memory controller, or a memory device. Device 1412 includes timing delay injector 1430 and circuit 1440. Tester 1410 connects to device 1412 via one or more test channels or lines 1450. In some embodiments, lines 1450 represent lines 1250, 1251, 1252, 1271, and 1272 of FIG. 12.

Tester 1410 provides test signals to device 1412 via lines 1450 to allow evaluation of circuit 1440 of device 1412. The test signals on lines 1450 include control signals CLT1, CTL2, input signal $D_{IN}$, and delay code CODE. In response to the signals CLT1, CTL2, $D_{IN}$ and the CODE, device 1412 generates delayed signal $D_{OUT}$ having a delay relative to the $D_{IN}$ signal based on the CODE. The $D_{OUT}$ signal is used to evaluate the operation of circuit 1440.

In some embodiments, timing delay injector 1430 is located in tester 1410 instead of being located in device 1412.

Timing delay injector 1430 includes embodiments of timing delay injector 100 and other circuits described in FIG. 1 through FIG. 13.

Figure 15:
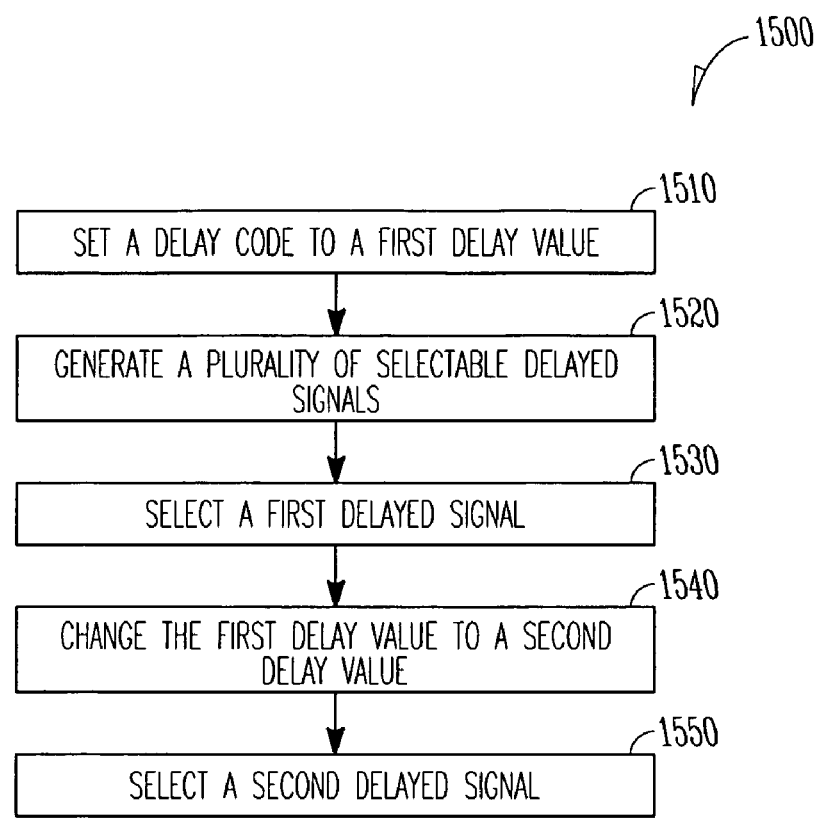
FIG. 15 is a functional diagram of a method of generating signals according to embodiments of the invention.

FIG. 15 is a functional diagram of a method 1500 of generating signals according to embodiments of the invention.

Box 1510 sets a delay code to a first delay value. In some embodiments, the delay code is a digital code and the first delay value includes a binary value. In some embodiments, the delay code is set by applying a first combination of programming signals to the device via pins of the device.

Box 1520 generates a plurality of selectable delayed signals. The selectable delayed signals are generated by a delay circuit of the device. In some embodiments, the selectable delayed signals are generated by a delay circuit such as delay circuits 120, 300, and 500 described above. Thus, the selectable signals are generated based on an input signal such as the $D_{IN}$ signal described above.

Box 1530 selects a first delayed signal. The first delayed signal is selected from the selectable delayed signals based on the first delay value.

Box 1540 changes the first delay value to a second delay value. In some embodiments, a second combination of programming signals is applied to the device to change the first delay value to the second delay value. The second combination of programming signals has a different value from the first combination of programming signals in box 1510. The first and second combinations of programming signals are applied to the device via pins of the device.

Box 1550 selects a second delayed signal. The second delayed signal is selected from the selectable delayed signals based on the second delay value. The selectable delayed signals in box 1530 and box 1550 are the same. For example, in both boxes 1530 and 1550, the same input signal is fed to the delay circuit of the device to generate the selectable delayed signals. Thus, the first delayed signal (selected in box 1530) and the second delay signal (selected in box 1550) are selected from the same selectable delayed signals. The difference between the first and second selectable delayed signals is in the amount of delay in each of the first and second selectable delayed signals relative to the input signal.

In method 1500, the relationships between the values of the delay code and the selectable signals are known relationships such that each value of the delay code may be used to select a known delayed signal from the selectable delayed signals. For example, after a first delayed signal is selected, a second delayed signal with a specific delay relative to the first delayed signal may be selected by setting the delay code to a delay value corresponding to the selection of the second delayed signal.

Method 1500 is useful for a number of applications. In some applications, the selected delayed signal of method 1500 may be fed to a second circuit for use as a timing or control signal. The second circuit may need timing or control signals with different delays relative to each other.

In other applications, method 1500 is used to evaluate a circuit such as a clock recovery circuit in an optical link transceiver.

In some embodiments, method 1500 is performed during a test to evaluate a performance of a circuit such as a clock recovery circuit in an optical link transceiver.

It should be noted that the individual activities shown in the functional diagram of FIG. 15 do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A device comprising:
an input circuit to receive an input signal;
a programmable delayed signal generator responsive to a delay code to delay the input signal to generate a delayed signal, wherein a value of the delay code is set independent of a timing of the delayed signal, the programmable delayed signal generator including a delay circuit to provide a plurality of selectable delayed signals, and a selector to select the delayed signal from the selectable delayed signals based on the delay code, wherein the selector includes a load, a number of input stages coupled to the load, each of the input stages including a pair of input nodes coupled to the delay circuit, and at least one output node coupled between the load and each of the input stages to provide the delayed signal; and
an output circuit coupled to the programmable delayed signal generator to provide the delayed signal.

2. The device of claim 1, wherein the delay circuit includes a number of delay cells arranged in multiple rows and multiple columns, wherein the columns are configured to provide a delay range, and wherein the rows are configured to provide a resolution of the delay range.

3. The device of claim 2, wherein the programmable delayed signal generator further includes a programmable row decoder, responsive to the delay code.

4. The device of claim 2, wherein the programmable delayed signal generator further includes a programmable column decoder, responsive to the delay code.

5. A device comprising:
an input circuit to receive an input signal;
a programmable delayed signal generator responsive to a delay code to delay the input signal to generate a delayed signal, the programmable delayed signal generator including a delay circuit to provide a plurality of selectable delayed signals, and a selector to select the delayed signal from the selectable delayed signals, based on the delay code, wherein the selector includes a load, a number of input stages coupled to the load, each of the input stages including a pair of input nodes coupled to the delay circuit, and at least one output node coupled between the load and each of the input stages to provide the delayed signal; and
an output circuit coupled to the programmable delayed signal generator to provide the delayed signal.

6. A device comprising:
an input circuit to receive an input signal;

a programmable delayed signal generator responsive to a delay code to delay the input signal to generate a delayed signal wherein the input circuit includes, at least one output node coupled to the programmable delayed signal generator, a load coupled to the output node, a current source, and a switching circuit coupled between the load and the current source to control a signal at the output node based on the input signal; and an output circuit coupled to the programmable delayed signal generator to provide the delayed signal, wherein the output circuit includes an input unit having mirrored input stages, and an output unit having mirrored output stages.

7. The device of claim 6, wherein each of the mirrored input stages includes:
a load;
a current source; and
a switching circuit coupled between the load and the current source.

8. The device of claim 7, wherein each of the output stages includes:
a load; and
a switching circuit coupled between the load and the current source.

9. A device comprising:
an input circuit to receive a differential input signal pair;
a delay circuit to delay the differential input signal pair to provide a number of differential delayed signal pairs based on a delay code, the delay circuit including a number of delay cells arranged in rows and columns;
a selector to select from the differential delayed signal pairs a selected differential delayed signal pair based on the delay code, wherein a value of the delay code is set independent of a timing of the selected differential delayed signal pair, and wherein each of the delay cells includes multiple output nodes to provide one of the differential delayed signal pairs; and
an output circuit to provide a differential output signal pair based on the selected differential delayed signal pair.

10. The device of claim 9, wherein the delay circuit includes a number of delay cells arranged in rows and columns.

11. The device of claim 10, wherein the delay circuit further includes a programmable row decoder, responsive to the delay code.

12. The device of claim 10, wherein the delay circuit further includes a programmable column decoder, responsive to the delay code.

13. A device comprising:
an input circuit to receive a differential input signal pair;
a delay circuit to delay the differential input signal pair to provide a number of differential delayed signal pairs based on a delay code, the delay circuit including a number of delay cells arranged in rows and columns;
a selector to select from the differential delayed signal pairs a selected differential delayed signal pair based on the delay code, wherein the selector includes a load, a number of input stages coupled to the load, each of the input stages including a pair of input nodes coupled to a pair of output nodes of one of the delay cells, and a pair of output nodes coupled between the load and each of the input stages to provide the differential output signal pair; and
an output circuit to provide a differential output signal pair based on the selected differential delayed signal pair.

14. A device comprising:
an input circuit to receive a differential input signal pair;

a delay circuit to delay the differential input signal pair to provide a number of differential delayed signal pairs based on a delay code, the delay circuit including a number of delay cells arranged in rows and columns, wherein each of the delay cells includes multiple output nodes to provide one of the differential delayed signal pairs;
a selector to select from the differential delayed signal pairs a selected differential delayed signal pair based on the delay code; and
an output circuit to provide a differential output signal pair based on the selected differential delayed signal pair.

15. A device comprising:
an input circuit to receive a differential input signal pair wherein the input circuit includes a load, a current source, and a switching circuit coupled between the load and the current source;
a delay circuit to delay the differential input signal pair to provide a number of differential delayed signal pairs based on a delay code;
a selector to select from the differential delayed signal pairs a selected differential delayed signal pair based on the delay code; and
an output circuit to provide a differential output signal pair based on the selected differential delayed signal pair, wherein the output circuit includes an input unit having minored input stages to receive the selected differential delayed signal pair from the selector, and an output unit having minored output stages to provide the differential output signal pair.

16. The device of claim 15, wherein each of the output stages includes: a load; and
a switching circuit coupled between the load and the current source.

17. An apparatus comprising:
an input buffer to receive an input signal, the input buffer including a load, a current source, and a switching circuit coupled between the load and the current source;
a timing delay injector coupled to the input buffer to selectively delay the input signal in response to at least one delay code to generate a plurality of delayed input signals, wherein a value of the delay code is set independent of timing of the delayed input signals, wherein the timing delay injector includes:
a plurality of coupled delay lines coupled to the input buffer;
a programmable delay-line column decoder;
a programmable delay-line row decoder;
a row multiplexer; and
an output buffer to output at least one of the delayed input signals.

18. The apparatus of claim 17, further comprising:
a device responsive to the at least one of delayed input signals from the timing delay injector, wherein the input buffer, the timing delay injector, and the device are formed on a die.

19. The apparatus of claim 17, wherein the coupled delay lines are to generate a plurality of phase differences in the input signal.

20. The apparatus of claim 17, wherein the delay injector includes a number of delay cells arranged in multiple rows and multiple columns, wherein the columns are configured to provide a delay range, and wherein the rows are configured to provide a resolution of the delay range.

21. A device comprising:
a substrate including a first substrate region and a second substrate region;

a circuit located on the first substrate region; and a digital timing delay injector located on the second substrate region, the digital timing delay injector including multiple rows and multiple columns of delay cells, wherein the digital timing delay injector is configured to be programmable with a number of delay codes to provide the circuit with a plurality of delayed signals, wherein values of the delay codes are set independent of timing of the delayed signals, the timing delay injector including a delay circuit to provide the plurality of selectable delayed signals, and a selector to select from the plurality of selectable delayed signals based on the delay codes to provide the plurality of delayed signals, wherein the selector includes a load, a number of input stages coupled to the load, each of the input stages including a pair of input nodes coupled to the delay circuit, and at least one output node coupled between the load and each of the input stages to provide at least one of the plurality of delayed signals.

22. The device of claim 21, wherein the substrate includes a monolithic semiconductor material.

23. The device of claim 22, wherein the material includes silicon.

24. The device of claim 22, wherein the substrate includes an integrated circuit die.

25. The device of claim 21, wherein each of the delay cells includes a cell delay, wherein the digital timing delay injector is configured to provide a first delayed signal based on a first delay code of the number of delay codes, wherein the digital timing delay injector is configured to provide a second delayed signal based on a second delay code of the number of delay codes, and wherein a relative delay between the first and second delayed signals is less than the cell delay.

26. The device of claim 25, wherein the digital timing delay injector includes a programmable row decoder, responsive to the first delay code.

27. The device of claim 26, wherein the digital timing delay injector includes a programmable column decoder, responsive to the second delay code.

28. The device of claim 21, wherein the digital timing delay injector is configured to provide the delayed signals to the circuit in response to a first control signal.

29. The device of claim 28, wherein the digital timing delay injector is configured to be inoperative in response to a second control signal.

30. The device of claim 21, further comprising an input node to receive an input signal and a signal path coupling the input node, the digital timing delay injector, and the circuit, wherein the device is configured to bypass the digital timing delay injector to feed the input signal directly from the input node to the circuit.

31. The device of claim 30, wherein the first circuit includes a clock recovery circuit.

32. A system comprising:
a first device;
an optical link coupled to the first device; and
a second device coupled to the optical link, the second device including an input circuit to receive a differential input signal pair, a programmable delayed signal generator including a delay circuit having a number of delay cells ranged in rows and columns to delay the differential input signal pair based on a digital delay code to generate a number of selectable delayed signal pairs, and a programmable selector responsive to the digital delay code to select at least one of the delayed signal pairs to provide a differential delayed signal pair, wherein at least one of the delay cells includes multiple output nodes to provide the differential delayed signal pair, and an output circuit to provide a differential output signal pair based on the differential delayed signal pair, wherein a value of the digital delay code is set independent of a timing of the differential delayed signal pair.

33. The system of claim 32, wherein the second device is included in a tester separated from the first device.

34. A method comprising:
setting a delay code to a first value: generating a plurality of selectable delayed signals at a device based on an input signal provided by an input circuit, wherein the input circuit includes a load, a current source, and a switching circuit coupled between the load and the current source, wherein the generating the plurality of selectable delayed signals includes feeding the input signal through rows and columns of delay cells of a delay circuit of the device, wherein the plurality of selectable delayed signals are provided at a plurality of output nodes of the delay circuit;

selecting a first delayed signal from the plurality of selectable delayed signals to be a selected delayed signal, wherein the first delayed signal is selected based on the first valve;

setting the delay code to a second value: and selecting a second delayed signal from the plurality of selectable delayed signals to be the selected delayed signal, wherein the second delayed signal is selected based on the second value, and wherein the setting of the delay code to the first and second values is independent of a timing of the selected delayed signal.

35. The method of claim 34, wherein the delay code includes a digital delay code.

36. The method of claim 34, wherein the setting the delay code to one of the first and second values includes applying a plurality of programmable signals to a number of pins of the device.

37. The method of claim 34, wherein the input signal and the first delayed signal have a first relative delay, wherein the input signal and the second delayed signal have a second relative delay, and wherein a difference between the first relative delay and the second relative delay is less than a delay of each of the delay cells.

38. A method comprising:
testing a circuit on a die using a programmable digital timing delay injector formed on the die, the programmable digital timing delay injector being responsive to an input signal and to a delay code to provide a delayed signal to the circuit, wherein a value of the delay code is set independent of a timing of the delayed signal, and wherein the input signal is provided by an input circuit, wherein the input circuit includes a load, a current source, and a switching circuit coupled between the load and the current source, wherein, in testing, the circuit includes a clock recovery circuit having a plurality of input nodes, and wherein the delayed signals are provided to at least one of the input nodes.

39. The method of claim 38, wherein the programmable digital timing delay injector generates a plurality of delayed signals in response to the input signal, and wherein the programmable digital timing delay injector selects one of the delayed signals in response to the delay code.

40. A method comprising:
testing a circuit on a die using a programmable digital timing delay injector formed on the die, the programmable digital timing delay injector being responsive to an input signal and to a delay code to provide a delayed signal to the circuit, wherein a value of the delay code is set independent of a timing of the delayed signal, and wherein the input signal is provided by an input circuit, wherein the input circuit includes a load, a current source, and a switching circuit coupled between the load and the current source, wherein, in testing, the programmable digital timing delay injector simultaneously generates a plurality of delayed signals in response to the input signal, and wherein the programmable digital timing delay injector selects at least two of the delayed signals in response to the delay code.

* * * * *

UNITED STATES PATENT AND TRADEMARK OFFICE
CERTIFICATE OF CORRECTION

PATENT NO.         : 7,348,821 B2                                    Page 1 of 1
APPLICATION NO. : 10/946709
DATED               : March 25, 2008
INVENTOR(S)        : Xu et al.

It is certified that error appears in the above-identified patent and that said Letters Patent is hereby corrected as shown below:

In column 15, line 10, in Claim 6, delete "signal ," and insert -- signal, --, therefor.

In column 16, line 25, in Claim 15, delete "pair ," and insert -- pair, --, therefor.

In column 16, line 27, in Claim 15, delete "minored" and insert -- mirrored --, therefor.

In column 16, line 29, in Claim 15, delete "minored" and insert -- mirrored --, therefor.

In column 17, line 46, in Claim 30, delete "21," and insert -- 21 --, therefor.

In column 17, line 61, in Claim 32, delete "ranged" and insert -- arranged --, therefor.

In column 18, line 10, in Claim 34, delete "value:" and insert -- value; --, therefor.

In column 18, line 24, in Claim 34, delete "valve;" and insert -- value; --, therefor.

In column 18, line 25, in Claim 34, delete "valve:" and insert -- value; --, therefor.

Signed and Sealed this

Nineteenth Day of August, 2008

JON W. DUDAS
*Director of the United States Patent and Trademark Office*